United States Patent [19]

Mageland et al.

[11] Patent Number: 5,027,057
[45] Date of Patent: Jun. 25, 1991

[54] INPUT CONDITION SENSING CIRCUIT

[75] Inventors: Otto M. Mageland, Greenfield; Gregory A. Pascucci, Waukesha, both of Wis.

[73] Assignee: Johnson Service Company, Milwaukee, Wis.

[21] Appl. No.: 472,022

[22] Filed: Jan. 30, 1990

[51] Int. Cl.⁵ .............................................. G01R 15/08
[52] U.S. Cl. ...................................... 324/115; 324/537
[58] Field of Search ................... 324/115, 121 R, 537, 324/123 R

[56] References Cited

U.S. PATENT DOCUMENTS 2,412,350 12/1946 Morgan ........................... 324/121 R
2,558,282 6/1951 Triplett ................................ 324/115

FOREIGN PATENT DOCUMENTS 0060828 5/1980 Japan .................................. 324/537

OTHER PUBLICATIONS

Hewlett-Packard Ad; Electronics; Nov. 11, 1976; page (inside front cover); Copy in 324/115.
Poenisch, A. P.; "Thermocouple . . .", IBM Tech. Dis. Bull.; vol. 20, No. 5; Oct. 1977; p. 1954.

Primary Examiner—Ernest F. Karlsen
Attorney, Agent, or Firm—Foley & Lardner

[57] ABSTRACT

There is disclosed an input condition sensing circuit for use in a facility management system which is selectively operable in a first mode for sensing the presence or absence of a voltage potential or a second mode for sensing a high or low impedance and which provides a binary output signal indicative of the condition being sensed and an amplifier coupled to the input for generating a control signal having an amplitude relating to the input condition being sensed. The circuit also includes detecting means coupled to the amplifier for providing a binary output in response to the control signal and indicative of the condition being sensed and select means coupled to the detecting means for selectively conditioning the circuit for operating in either the first or second mode. The select means is arranged to cause the detecting means to provide a first binary output state in response to sensing the presence of a voltage while in the first operating mode and a cause the detecting means to provide a different binary output state in response to sensing a high impedance while in the second operating mode.

37 Claims, 2 Drawing Sheets

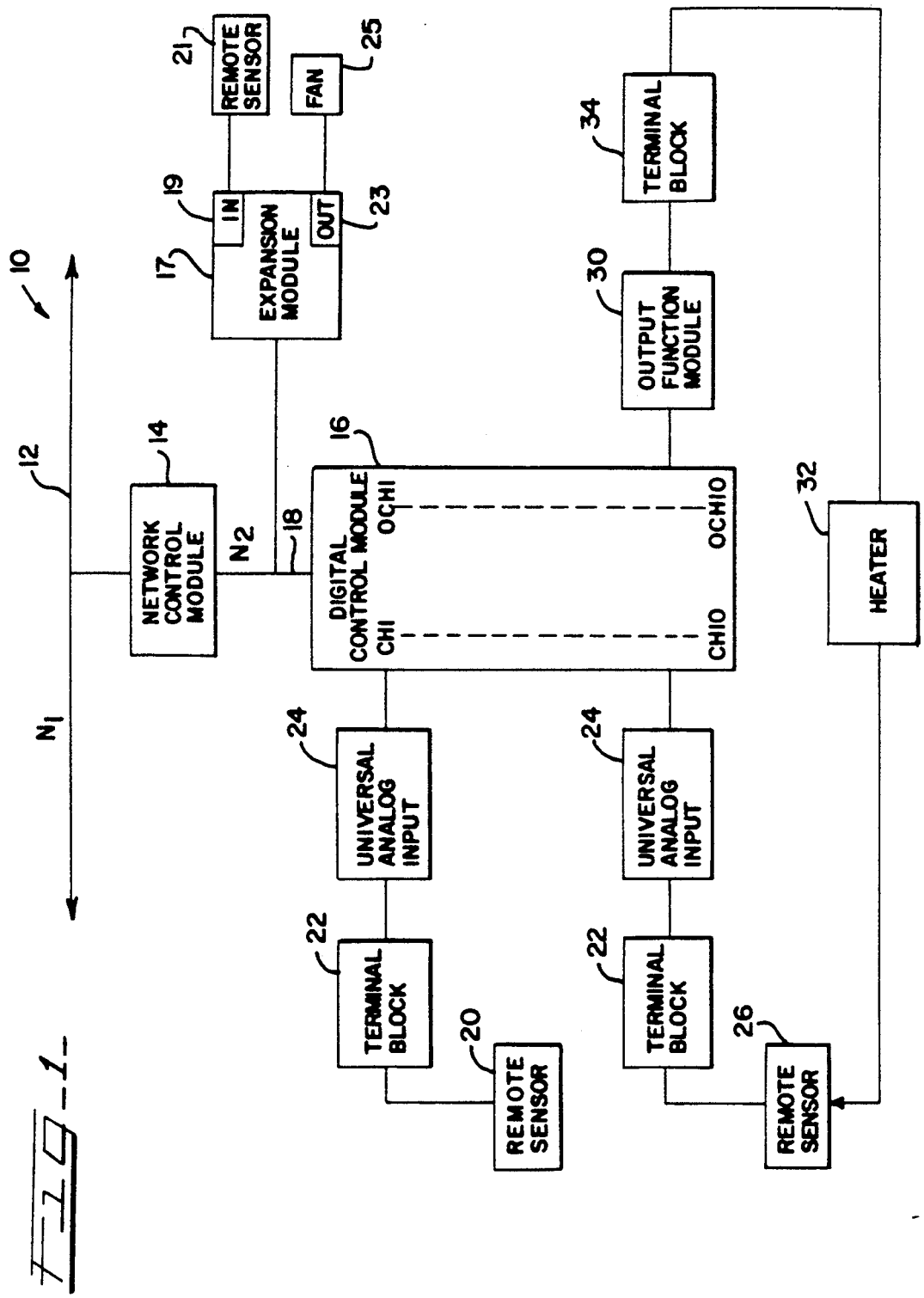

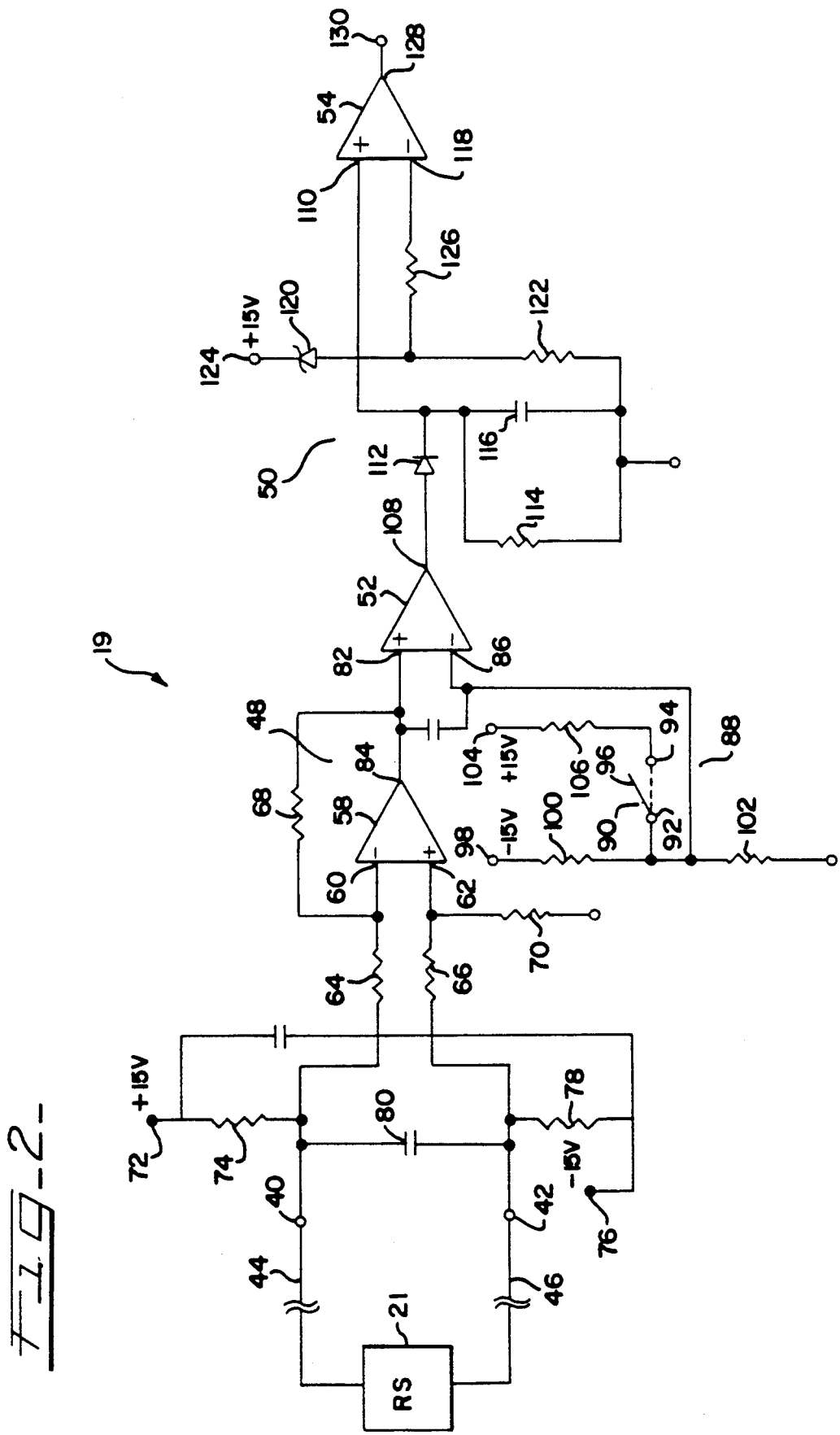

INPUT CONDITION SENSING CIRCUIT

BACKGROUND OF THE INVENTION

The present invention generally relates to an input condition sensing circuit and more particularly to such a circuit which is configurable for sensing across a wire pair either the presence or absence of a voltage or a low or high impedance. The input condition sensing circuit finds particular applicability for use in a facility management system.

Facility management systems are used in virtually every type of large commercial structure including office buildings, hotels, manufacturing facilities, and the like. Such systems provide monitoring and control of internal environment conditions in such structures and may also, in many applications, provide monitoring of fire alarm and security systems. Facility management systems monitor and control internal environment conditions such as, for example, temperature, humidity, air quality, and air circulation.

To provide such monitoring and control, facility management systems employ sophisticated control equipment which perform closed-loop operations for maintaining the internal environment conditions of points distributed throughout a structure at certain desired set points. To that end, facility management systems generally include remote devices distributed throughout a structure which include temperature, air quality or humidity sensors which sense various parameters to be controlled and field devices such as fan motors, heaters, and dampers which are turned on and off or set to desired levels by the control equipment. The control equipment operate the field devices responsive to the parameter levels being sensed by the remote sensors and preselected set points which are preprogrammed into the control equipment. The field devices, because they are distributed throughout a structure, are generally coupled to the control equipment by relatively long cables which may include wire pairs.

In order to provide proper control, the control equipment of facility management systems must be able to discern whether field devices are operating. For example, a system may need to detect whether a certain fan is on or off. This may be accomplished by sensing if a pair of air flow detector relay contacts are open or closed or whether a fan is receiving power by detecting whether a voltage potential is present or absent at the fan power relay. For detecting such conditions, the air flow detector relay contacts and fan power relay terminals are coupled back to the control equipment by relatively long cables including a wire pair.

If an air flow detector is used, the control equipment will detect a low impedance across the wire pair indicating that the relay contacts of the flow detector are closed, and if the fan motor is not running, the control equipment will detect a high impedance across the wire pair indicating that the relay contacts are open. Because wire pairs and relay contacts impose impedance of its own, an impedance of, for example, 100,000 ohms or less may indicate closed contacts, and an impedance of 800,000 ohms or more may indicate open contacts. If the system is arranged to detect power, the control equipment will detect the presence of a voltage potential, such as 120 volts AC, across the wire pair when the fan is running and will detect the absence of a voltage potential across the wire pair if the fan is not running.

The control equipment of modern-day facility management systems generally utilize digital circuitry for processing data. Hence, with such equipment, it is necessary to provide information, such as the presence or absence of a voltage potential, or a low or high impedance in binary form. This may be achieved through the use of an input condition sensing circuit of the type to which the present invention pertains. Many condition-sensing inputs are generally required in a facility management system. In the past, different types of input condition sensing circuits have been required for sensing impedance and voltage. Hence, a given condition sensing input has been dedicated for a specific type of input condition, either a voltage condition or an impedance condition. In many applications, this can unduly limit the number and type of field devices employed. Also, if the same input condition circuit is used for sensing both voltages and impedances, there is a potential safety hazard to maintenance personnel. This results because the impedance counterpart to a voltage present condition is a high impedance (open contact) condition. If the same input condition sensing circuit is used for both applications, the circuit will provide the same binary output for both a voltage present condition and a high impedance condition. Hence, if a maintenance technician is disconnecting a wire pair having a voltage across the wires from the control equipment, this will create a contact open condition. He, therefore, will not see a change in the output binary state of the input condition sensing circuit and may become confused as to whether or not a voltage is present. This creates the potential of the maintenance technician touching both wires and receiving a potentially fatal electric shock.

The present invention overcomes the aforementioned problems by providing an input condition sensing circuit which is configurable to operate in either a first mode for sensing the presence or absence of a voltage potential or a second mode for detecting a low or high impedance. In doing so, the input condition sensing circuit of the present invention is arranged to provide different binary outputs for the presence of a voltage and for an open circuit condition. The input condition sensing circuit may be employed whenever a binary output is desired responsive to the presence or absence of a voltage or a low or high impedance condition. As will be seen hereinafter, the input condition sensing circuit of the present invention is preferably employed in a facility management system expansion module which provides a binary input interface to the facility management control equipment.

SUMMARY OF THE INVENTION

The invention therefore provides an input condition sensing circuit selectively operable in a first mode for sensing the presence or absence of a voltage potential or a second mode for sensing a low or high impedance and providing a binary output signal indicative of the condition being sensed. The circuit includes an input adapted to be coupled to the condition to be sensed, an amplifier coupled to the input for generating a control signal having an amplitude related to the input condition being sensed, and detecting means coupled to the amplifier for providing a binary output in response to the control signal and indicative of the condition being sensed. The circuit further includes select means coupled to the detecting means for selectively conditioning the circuit for operating in either the first or second mode.

The select means may be arranged to cause the detecting means to provide a first binary output state, such as a logical one state, in response to sensing the presence of a voltage while in the first operating mode and to cause the detecting means to provide the first binary output state (logical one state) in response to sensing a low impedance while in the second operating mode.

BRIEF DESCRIPTION OF THE DRAWINGS

The features of the present invention which are believed to be novel are set forth with particularity in the appended claims. The invention, together with further objects and advantages thereof, may best be understood by reference to the following description in conjunction with the accompanying drawings, and in several figures of which like reference numerals indicate identical elements, and in which:

FIG. 1 is a block diagram of a facility management system embodying the present invention; and FIG. 2 is a schematic circuit diagram of an input condition sensing circuit embodying the present invention.

DESCRIPTION OF THE PREFERRED EMBODIMENT

Referring now to FIG. 1, it illustrates a control system 10 which may utilize the present invention to advantage, and, more particularly, a facility management system embodying the present invention. The system 10 generally includes a main communication bus 12, which may be an N1 LAN ARCNET bus, a network control module 14, a digital control module 16, an expansion module 17, and another bus 18, which may be an N2 OPTOMUX bus interconnecting the network control module 14 to the digital control module 16 and the expansion module 17. LAN ARCNET and OPTOMUX buses 12 and 18 respectively are of the type well known in the art.

As illustrated in FIG. 1, the system there shown includes just one network control module, digital control module and expansion module for exemplary purposes, and it should be understood that additional network control modules, digital control modules, and expansion modules may be connected to the main communication bus in a practical system. This type of control system is referred to as a "distributed system", wherein each network control module is on a par with all other network control modules and communicates will all other network control modules on the bus 12.

The main function of the network control module is to communicate with the other network control modules of the system on an equal basis and to control its associated digital control module and expansion module under its own assigned software protocol. Such a protocol may include setting temperature control set points, heating schedules, lighting schedules, et cetera. The network control module, in accordance with its protocol, sends high-level commands to the digital control module which then executes on those commands by performing closed-loop operations by issuing suitable control signals at its outputs responsive to sensed input conditions by its remote sensors. The network control module also receives from the expansion module binary information indicative of the conditions at the remote sensors coupled to the expansion module and acts upon the received binary information according to its protocol. The network control module also issues commands to the expansion module for causing the expansion module to issue binary control signals to control field devices coupled to it.

The control signals issued by the digital control module are preferably in digital form. The digital control signals issued by the digital control module are converted by output function modules to a format which may be utilized for controlling various different types of external devices which may be utilized within the system. For example, one type of output function module may convert the digital output signals to binary signals. Another output function module may convert the digital control signals to open or closed contacts of a relay, and still another output function module may convert the digital control signals to an analog voltage. The function modules which provide open or closed relay contacts may be used to activate fan motor starter windings or to turn on heaters. An output function module which provides an analog control signal can be used to power a damper motor to set a damper at a desired position. Hence, the digital control module performs decision-making processes, gathers information from its remote sensors, digitizes the information, digitally processes the information, and executes control functions to satisfy the high-level commands of the network control module.

The digital control module 16 thus processes digital information for performing various different types of closed-loop control operations within the system. To that end, the digital control module 16 may include 10 output channels identified as OCH1 through OCH10. The outputs OCH1 through OCH10 provide the control signals which are transferred and converted by the output function modules to control the various different types of control elements of the system, such as relays or damper motors, to provide the desired control of the internal environment of, for example, an office building.

In order to provide closed-loop control, the digital control module 16 may include 10 input channels CH1 through CH10. These input channels receive various different kinds of information from remote sensors from within the system, which remote sensors provide analog input information of various types indicative of the conditions being sensed by the remote sensors. The input channels CH1 through CH10 are arranged to read analog input information, and preferably, a differential voltage.

Because various types of remote sensors may be required, the analog information provided by the remote sensors may be of various different types of analog information. For example, a temperature sensor may take the form of a temperature dependant resistance so that the temperature sensor provides a resistance having a magnitude which is indicative of the temperature being sensed. Other types of remote sensors may provide analog information of the condition being sensed in the form of a voltage magnitude or a current magnitude carried through a two-wire current loop. As a result, the system 10 preferably includes a universal analog input (IAU) 24 associated with each input channel CH1 through CH10. The universal analog inputs 24 interface the remote sensors with the digital control module inputs to convert the various different types of analog information provided by the remote sensors to a given type of analog information, such as a differential voltage which is readable by the input channels CH1 through CH10 of the digital control module.

To that end, the control system 10 of FIG. 1 is illustrated as including a remote sensor 20 which is coupled to the first input channel (CH1) of the digital control module by an input interface which includes a terminal block 22 and a universal analog input circuit (IAU) 24. Similarly, another remote sensor 26 is shown coupled to the tenth input channel (CH10) by an identical terminal block 22 and an identical universal analog input circuit 24.

The terminals blocks 22 are adapted for connecting the remote sensors to the control system. The universal analog input circuits 24 provide an interface disposed between the terminal blocks and the input channels. When the differential voltages at the input channels (CH1 through CH10) are read, these differential voltages are converted to another analog voltage having a magnitude indicative of the condition being sensed which is then received by the inputs of a data acquisition system within the digital control module 16. The data acquisition system thereafter converts the analog voltage to digital data in a bit-parallel format for storage in memory and subsequent digital processing by the digital control module 16.

Since the digital control module includes 10 output channels, it may perform up to 10 separate closed loop control operations. One such closed-loop control operation is illustrated in FIG. 1 in connection with the 10th output channel (OCH10). Output channel OCH10 is coupled to an output function module 30. The output function module 30 may include a relay for turning a heater 32 on and off. The output function module 30 is coupled to the heater through a terminal block 34. When the relay of the output function module 30 closes, the heater 32 is turned on for heating an internal space, such as a room of a building.

The temperature of the room may be sensed by the remote sensor 26 which provides analog information in the form of a resistance having a magnitude indicative of the temperature being sensed. The resistance analog information provided by the remote sensor 26 is coupled to the 10th input channel (CH10) by the terminal block 22 and the universal analog input circuit 24. The temperature information from the remote sensor 26 is converted from a resistance magnitude to a differential voltage by an interface formed by the terminal block 22 and the universal analog input 24. When the differential voltage read at the 10th input channel (CH10) indicates that the room being heated by the heater 32 is at the desired temperature dictated by the high-level command of the network control module, the digital control module 1 6 through output channel OCH10 will open the relay of the output function module 30 to turn off the heater 32. When the room temperature falls below the desired temperature, that condition is sensed by the remote sensor 26, is converted to a differential voltage by the input interface including terminal block 22 and the universal analog input circuit 24, which then causes the digital control module to close the relay of the output function module 30 by its output channel OCH10. The foregoing closed-loop control operation continues until it is interrupted by either an operator, manually placing the output function module 30 into a manual mode, or by a command by the network control module 14 to the digital control module 16 through the bus 18.

The expansion module 17 performs two primary functions. Firstly, it expands the number of points from which the network control module 14 can derive information. Secondly, the expansion module provides additional output control points for the network control module 14 for controlling various types of field devices which respond to binary output signals.

In providing additional points for gathering information, the expansion module includes an input condition sensing circuit 19 which preferably embodies the present invention. The input condition sensing circuit is coupled to a remote sensor 21. For providing additional control output points, the expansion module includes an output 23 which is coupled to a field device such as a fan motor 25.

The input condition analog circuit 19 is arranged to sense the presence or absence of a voltage potential or a high or low impedance. In facility management systems of the type illustrated in FIG. 1, remote sensors may be of the type which are self-powered, and, at times, it may be necessary for the network control module 14 to discern whether the remote sensor is receiving power from its own power supply. In order to obtain that type of information, the input condition sensing circuit of the expansion module senses either the presence or absence of a voltage potential at the remote sensor 21 and converts that information to binary information. For example, if the input condition sensing circuit senses a voltage potential at the remote sensor 21, it may provide an output to the network control module which is a binary one. Conversely, if the input condition sensing circuit of the expansion module detects the absence of a voltage potential at the remote sensor 21, it may provide an output to the network control module which is a binary zero.

As will be seen hereinafter, the input condition sensing circuit is selectively operable for sensing the presence or absence of a voltage potential in a first operating mode, and for sensing a high or low impedance in the second operating mode. The sensing of a high or low impedance may be necessary if the remote sensor is of the type which includes a pair of relay contacts. For example, the remote sensor 21, may be a thermostat having a pair of relay or switch contacts which open and close responsive to a temperature being sensed. In the second mode of operation, the input condition sensing circuit may provide a binary one output to the expansion module in response to sensing a low impedance indicating closed relay contacts or a binary zero output upon sensing a high impedance indicating opened relay contacts. The input condition sensing circuit 19 may also be utilized for determining whether power is available to an external device such as a fan motor by sensing the presence or absence of a voltage at the fan motor starter winding or, may be used to confirm the operation of a relay which controls an external device by reading a high or low impedance associated with the opened or closed contacts of such a relay. The remote sensors and external devices such as fan motors or the like are connected to the expansion module through a relatively long cable including a wire pair. The input condition sensing circuit thus senses the presence or absence of a voltage or a high or low impedance across the wire pair in a manner to be described in greater detail hereinafter.

The expansion module 17, until the digital control module 16, does not perform closed-loop operations. Instead, it provides the network control module !4 with requested information and then, controls the external devices coupled to it under command by the network control module. In this manner, expansion modules may be utilized to expand the number of control points in a facility management system without the need of adding another digital control module if the additional sense or control points are of the binary type. Hence, the expansion module serves as a binary interface between the network control module 14 and the remote sensors and external devices coupled to it.

Referring now to FIG. 2, it illustrates in schematic circuit diagram form an input condition sensing circuit 19 embodying the present invention. The circuit 19 generally includes a pair of input terminals 40 and 42 adapted to be connected to a remote field device 21 through a wire pair comprising wires 44 and 46. The circuit further includes an amplifier stage 48 and a detecting stage 50 comprising a first comparator 52 and a second comparator 54.

The amplifier stage 48 includes an operational amplifier 58 having a negative input 60 and a positive input 62. The inputs 60 and 62 of the operational amplifier 58 are coupled to the input terminals 40 and 42 through a balanced input circuit comprising resistors 64 and 66. The resistors 64 and 66 form with resistors 68 and 70 voltage dividers coupled to each of the inputs 60 and 62 of the operational amplifier 58. The resistance values of resistors 64 and 66 are preferably equal in value and the resistance values of resistors 68 and 70 are preferably equal to maintain symmetry at the inputs 60 and 62 to provide a balanced input to the operational amplifier 58.

The input terminals 40 and 42 are also coupled to voltage sources for providing a bias voltage to the wire pair 44 and 46 for sensing the low impedance across the wire pair for a pair of closed contacts of the field device and for sensing a high impedance across the wire pair for a pair of open contacts of the field device 21. To that end, the terminal 40 is coupled to a +15 volt power source at terminal 72 through a resistor 74. In a similar manner, the terminal 42 is coupled to a −15 volt power source at a terminal 76 through a resistor 78. Resistors 74 and 78 are preferably of the same resistance. The equal resistance value of resistors 74 and 78 maintains the input symmetry for the amplifier stage 48 and also serves to isolate the voltage supplies from current due to potentially high voltage inputs on the wire pair 44 and 46. Coupled across the input terminals 40 and 42 is a capacitor 80. The capacitor 80 is provided to store the bias voltage and to provide a current spike to the relay contacts within the field device 21 for cleaning the contacts when the contacts are opened and closed.

The first comparator 52 of the detecting means 50 also comprises an operational amplifier and has a positive input 82 coupled to the output 84 of the amplifier stage operational amplifier 58. The comparator 52 also has a negative input 86 coupled to a mode select means 88 which provides the input 86 with a first reference voltage for conditioning the input condition sensing circuit 19 to operate in a first mode for sensing the presence or absence of a voltage across the wire pair 44 and 46 and a second reference voltage for conditioning the input condition sensing circuit to operate in a second mode for sensing a low or high impedance across the wire pair 44 and 46. To that end, the select means includes a switch 90 comprising poles 92 and 94 and a switch arm 96. The pole 92 is coupled to a −15 volt power supply at terminal 98 through a resistor 100 and to common potential through a resistor 102. The pole 92 is further coupled to the input 86 of the comparator 52. The pole 94 is coupled to a +15 volt power source at a terminal 104 through a resistor 106.

When the switch 90 is in a first position as indicated by the dashed switching arm so that poles 92 and 94 are coupled together, the select means 88 provides a reference potential to the input 86 of the comparator 52 for establishing the input condition sensing circuit in the first mode of operation. When the switch 90 is open, as indicated by the solid line switch arm 96, the mode select means 88 provides a different reference potential to the input 86 of the comparator 52 for conditioning the input condition sensing circuit for operating in its second mode of operation. The resistance values of resistors 100, 102 and 106 are selected such that the first reference voltage is on the order of +278 mv and the second reference potential is on the order −350 mv. The significance of the opposite polarity of the first and second reference voltages will be more fully referred to hereinafter.

Comparator 52 has an output 108 which is coupled to the positive input 110 of the second comparator 54 through a diode 112. The positive input 110 of comparator 54 is also coupled to common potential through an RC circuit comprising a resistor 114 and a capacitor 116. The comparator 54 also includes a minus input 118 which receives another reference potential. The reference potential at input 118 is provided by the series combination of a zener diode 120 and a resistor 122 which series combination is coupled between a +15 volt power source at terminal 124 and ground potential. The common junction of the zener diode 120 and the resistor 122 is coupled to the input 118 through a resistor 126. The zener diode 120 preferably has a breakdown voltage of 5.1 volts so that the reference potential at input 118 is on the order of +9.9 volts. Lastly, comparator 54 includes an output 128 which is coupled to an output terminal 130 which is the output of the input condition sensing circuit 19.

In the operation of the input condition sensing circuit 19, if the condition of the remote sensor to be sensed is a voltage, the switch 90 is first closed to render the input condition sensing circuit 90 for sensing the presence or absence of a voltage across a wire pair 44 and 46. This impresses a first reference voltage of +278 mv at the minus input 86 of comparator 52. If the voltage to be sensed is a DC voltage, the terminal 42 is coupled to a positive side of the voltage to be sensed and the terminal 40 is coupled to the minus side of the voltage to be sensed.

If a voltage difference is present across the wire pair 44 and 46 and the voltage on wire 46 is more positive than the voltage on wire 44, input 62 of the operational amplifier 58 will be more positive than the input 60 of the operational amplifier 58. Since the inputs of the operational amplifier 58 are coupled to the remote sensor 21 through a balanced input circuit, the output voltage of the operational amplifier 58 at its output 84 will have a magnitude related to the voltage difference across the wire pair 44 and 46. The values of resistors 64, 66, 68 and 70 are chosen so that the input condition sensing circuit is able to sense voltages of a wide range, ranging from approximately 7.5 volts to 250 volts. Even though the gain of the amplifier 58 is less than unity due to the values of resistors 68 and 64, if the voltage difference from wire 46 to wire 44 is above 7.5 volts, the voltage at output 84 which is impressed upon input 82 of comparator 52 will be greater than the reference voltage of 278 mv at the input 86 of the comparator 52. Conversely, a voltage difference from wire 44 to wire 46 greater than 7.5 volts will impress a negative voltage upon input 82 which is less than 278 mV. As a result, when the voltage difference from wire 46 to wire 44 is greater than 7.5 volts, the comparator 52 will provide a binary one output at output 108 having a value of approximately 13.5 volts. The 13.5 volt output is coupled to the input 110 of comparator 54. Since the 13.5 volts at input 110 is greater in value than the reference voltage of 9.9 volts at input 118, the comparator 54 will provide at the output terminal 130 a binary output having a value of approximately 13.5 volts. Hence, if the input condition sensing circuit 19 is sensing the presence of a voltage difference from wire 46 to wire 44 having a sufficient magnitude, it will provide a binary one output at output 130 when in the first mode of operation.

If there is no external voltage supplied from the remote sensor (RS) across the wire pair 44 and 46, then there will be no voltage potential difference across the inputs 60 and 62 of operational amplifier 58. As a result, the operational amplifier 58 will provide a zero volt output at output 84 which is impressed upon the input 82 of comparator 52. Since the voltage at input 82 of comparator 52 is now less than the 278 mv reference voltage at input 86, the comparator 52 will provide at output 108 a binary zero output of approximately −13.5 volts. Diode 112 will block a negative voltage, causing zero volts to be impressed upon the input 110 of comparator 54. This output is impressed upon the input 110 of comparator 54 which will be less than the voltage at input 118. As a result, the comparator 54 provides a binary zero output of approximately −13.5 volts at output 130. Hence, when the input condition sensing circuit 19 senses the absence of a voltage across the wire pair 44 and 46, it will provide a binary zero at output terminal 130 when in the first operating mode.

If the voltage present across the wire pair 44 and 46 is an AC voltage, then the output of comparator 52 will follow the positive and minus swings of the AC voltage and provide essentially a square-wave output having a 50% duty cycle having an amplitude ranging between approximately 13.5 volts and −13.5 volts. The diode 112 and RC circuit comprising resistor 114 and capacitor 116 transforms the square-wave voltage provided at the output 108 of comparator 52 into a DC voltage and this steady voltage is applied to the input 110 of comparator 54. As a result, comparator 54 will provide at the output terminal 130 a steady state binary one output of approximately 13.5 volts. The values of resistor 114 and capacitor 116 are selected such that the steady state binary one output provided by comparator 54 is obtained for AC voltages having frequencies of approximately 50 Hertz or greater. The time constant of the RC circuit is thus selected so that if the AC voltage has a frequency less than 50 Hertz, the capacitor 116 will not charge to a sufficient voltage so as to provide the input 110 of comparator 54 with a suitable voltage which is greater than the voltage at input 118 so that a binary Zero output will be obtained at the terminal 130. Hence, the RC circuit comprising resistor 114 and capacitor 116 serves as a frequency discriminating circuit.

It should also be noted that for input frequencies of ten Hertz or less, the RC circuit will cause the output 130 to reliably toggle at a frequency equal to the input frequency. This can be important, as for example, when reading a meter device which provides a pulsed output. Such meter devices include energy demand meters which provide a voltage pulse for each Kilowatt of power used.

If the condition to be sensed at the remote sensor 21 is a pair of closed relay contacts (a low impedance condition), or a pair of open relay contacts (a high impedance condition), the switch 90 is opened to impress upon input 86 of comparator 52 a reference voltage on the order of a −350 mv. If the relay contacts are closed and there is thus a low impedance across the wire pair 44 and 46, the inputs 60 and 62 of operational amplifier 58 will be at approximately the same voltage potential. This results in a corresponding output of approximately zero volts at the output 84 of the operational amplifier 58. The zero volts output is impressed upon the input 82 of the comparator 52. Since the input 82 of comparator 52 is more positive than the input 86 of comparator 52, comparator 52 will provide at its output 108 a binary one output of approximately 13.5 volts which is impressed upon the input 110 of comparator 54 through the diode 112. Since the voltage at input 110 of comparator 54 is greater than the reference voltage at input 118, the comparator 54 will provide a binary one output of approximately 13.5 volts at the terminal 130. Hence, when the input condition sensing circuit is operating in its second mode to detect an impedance across the wire pair 44 and 46, if the impedance across the wire pair is of low impedance, the input condition sensing circuit will provide a binary one output at the output terminal 130.

If the relay contacts of the remote sensor 21 are open, a high impedance will exist across the wire pair 44 and 46. By virtue of the bias provided across the wire pair 44 and 46 by the power terminals 72 and 76 and the biasing resistors 74 and 78, the input 40 will be more positive than the input 42 thereby causing the output 84 of operational amplifier 58 to be a negative voltage. Hence, the voltage at input 82 of comparator 52 will be more negative than the −350 mv reference voltage at input 86 to cause comparator 52 to provide a binary zero output at its output 10. The binary zero output is impressed upon the input 110 of comparator 54. Since the voltage at the input 110 of comparator 54 is less than the voltage at its input 118, comparator 54 will provide output terminal 130 with a binary zero output. Hence, when the input condition sensing circuit is operating in its second mode of operation and a high impedance exits across the wire pair 44 and 46, the input condition sensing circuit will provide a binary zero output at its output terminal 130.

Since the wire pair 44 and 46 may be of considerable length, it is recognized that the wire pair 44 and 46 will impose some impedance at the input terminals 40 and 42. As a result, the reference potential applied to input 86 of comparator 52 is selected so that any impedance of 100,000 ohms or less is considered to be low impedance corresponding to closed relay contacts and any impedance of above 800,000 ohms is considered to be high impedance corresponding to open relay contacts.

As can be seen from the foregoing, the input condition sensing circuit when in its first mode of operation provides a binary one output when a positive voltage is present across the wire pair 46 and 44. The input condition sensing circuit also provides a binary one output when operating in the second mode and when a low impedance condition exists across the wire pair 44 and 46. These binary outputs under these conditions are obtained because input 86 of comparator 52 is provided with a positive reference voltage when in the first mode of operation for detecting the presence of a voltage and a negative reference voltage when in the second mode of operation for detecting a low or high impedance. Hence, the polarity of the reference voltages determines the binary output levels for the various input conditions.

If mode selecting means 88 were not provided and the input condition sensing circuit is utilized for detecting both the presence or absence of a voltage and a low or high impedance across a wire pair, a condition would obtain which would be potentially hazardous to maintenance personnel. Since the counterpart to a voltage being present is a high impedance or open relay contacts, if the mode selecting means 88 were not provided as described herein, the presence of a voltage would result in the same binary output level as the high impedance resulting from open contacts across the wire pair or even a broken wire. This is potentially hazardous to maintenance personnel because if a voltage is being sensed and the wire pair is disconnected from the input terminals 40 and 42, the maintenance personnel would be creating an open relay contact condition which would provide the same binary output as previously provided for the voltage present condition. A maintenance technician could therefore become confused as to whether a voltage is present across the wire pair and, should the maintenance technician touch both wires of the wire pair at the same time, the maintenance technician could obtain a potentially fatal electrical shock. However, with the configuration of the input condition sensing circuit 19 illustrated in FIG. 2, if a voltage is present across the wire pair, and the select means switch is opened, the technician will see a change in state at the binary output of the input condition sensing circuit and then will realize that he has created an open circuit condition across the inputs to the circuit and realize that a voltage may still be present across the wire pair and treat the wire pair accordingly.

An added feature of the input condition sensing circuit of FIG. 2 also resides in the fact that the RC circuit comprising resistor 114 and capacitor 116 will always result in a binary one output any time a frequency is present across the wire pair of 50 Hertz or greater. Hence, even if the circuit is conditioned by the mode select means for operating in the second mode for detecting a low or high impedance, if for some reason, an AC voltage becomes present across the wire pair, this condition will be detected by a binary one output of the circuit.

While a particular embodiment of the present invention has been shown and described, modifications may be made, and it is therefore intended to cover in the appended claims all such changes and modifications which fall within the true spirit and scope of the invention.

What is claimed is:

1. An input condition sensing circuit selectively operable in a first mode for sensing the presence or absence of a voltage potential or a second mode for sensing a high or low impedance and providing a binary output signal indicative of the condition being sensed, said circuit comprising:
   an input means for effecting said sensing, said input means being adapted to be coupled to the condition to be sensed;
   an amplifier coupled to said input means for generating a control signal having an amplitude related to the condition being sensed;
   detecting means coupled to said amplifier for providing a binary output in response to said control signal, said control signal being indicative of said condition being sensed; and
   select means to said detecting means for selectively conditioning said circuit for operating in either said first or second mode;
   said select means being arranged to cause said detecting means to provide a first binary output state in response to sensing the presence of a voltage while in said first operating mode and to cause said detecting means to provide said first binary output state in response to sensing a low impedance while in said second operating mode.

2. A circuit as defined in claim 1 wherein said first binary output state is a binary one.

3. A circuit as defined in claim 1 wherein said select means is arranged to cause said detecting means to provide a second binary output state in response to sensing the absence a voltage while in said first operating mode and to cause said detecting means to provide said second binary output state in response to sensing a high impedance while in said second operating mode.

4. A circuit as defined in claim 3 wherein said second binary state is a binary zero.

5. A circuit as defined in claim 1 wherein said input means includes a balanced input circuit coupling said amplifier to a pair of input terminals.

6. A circuit as defined in claim 5, wherein said amplifier comprises an operational amplifier having a pair of inputs coupled to said balanced input circuit.

7. A circuit as defined in claim 6 wherein said amplifier has a gain less than unity.

8. A circuit as defined in claim 5 further including biasing means for providing each of said pair of input terminals with a bias voltage.

9. A circuit as defined in claim 1 wherein said detecting means comprises a first comparator.

10. A circuit as defined in claim 9 wherein said first comparator has a first input pin coupled to said amplifier for receiving said control signal and a reference input coupled to said select means.

11. A circuit as defined in claim 10 wherein said select means includes means for providing said reference input pin with a first reference voltage for selecting said first operating mode and a second reference voltage for selecting said second operating mode.

12. A circuit as defined in claim 11 wherein said first reference voltage is a positive voltage.

13. A circuit as defined in claim 11 wherein said second reference voltage is a negative voltage.

14. A circuit as defined in claim 9 wherein said first comparator includes an output pin for providing an intermediate binary signal and wherein said detecting means further includes a second comparator having a first input post coupled to said first comparator output for receiving said intermediate binary output signal a reference input post coupled to a voltage reference potential, and an output post for providing said binary output signal.

15. A circuit as defined in claim 14 further including an RC circuit coupled between said second comparator first input post and common potential.

16. A circuit as defined in claim 15 wherein said circuit is arranged for sensing the presence of an AC voltage at said input means and wherein said RC circuit is arranged to maintain a substantially constant potential at said second comparator first input post, said RC circuit being responsive to said intermediate binary signal representative of said sensed AC voltage, and said second comparator providing a constant binary output at said second comparator output post.

17. A circuit as defined in claim 16 wherein said RC circuit is arranged to maintain said substantially constant potential for sensed DC voltage and for sensed AC voltages having frequencies of at least fifty Hertz.

18. A circuit as defined in claim 15 wherein said RC circuit is arranged to cause said binary output signal to change state responsive to AC voltages sensed at said input having frequencies of about 10 Hertz or less.

19. A circuit as defined in claim 15 wherein said detecting means further comprises a diode coupling said first comparator output pin to said second comparator first input post.

20. An input condition sensing circuit for use in a facility management system for sensing a condition of a remote device coupled to said circuit by a wire pair, said circuit comprising:
a pair of input terminals adapted to be coupled to said wire pair;
biasing means for applying a bias voltage to each of said pair of input terminals;
an amplifier coupled to said pair of input terminals for providing a control signal related to a sensed condition of said remote device;
detecting means coupled to said amplifier and responsive to said control signal for providing a binary output voltage indicative of the sensed condition of said remote device, said detecting means being operable in a first mode for detecting the presence or absence of a voltage across said wire pair or in a second mode for detecting low or high impedance across said wire pair; and
mode select means for selectively rendering said detecting means operable in either said first or second mode, said rendering causing said detecting means to provide a first binary output responsive to the presence of a voltage across said wire pair when operating in said first mode and providing said first binary output responsive to a low impedance across said wire pair when operation in said second mode, said rendering causing said detecting means to provide a second binary output responsive to the absence o a voltage across said wire pair when operating in said second mode and providing said second binary output responsive to a high impedance across said wire pair when operating in said first mode.

21. A circuit as defined in claim 20 further including a balanced input circuit coupling said amplifier to said pair of input terminals.

22. A circuit as defined in claim 20 wherein said first binary output is a binary one.

23. A circuit as defined in claim 22 wherein said second binary output is a binary zero.

24. A circuit as defined in claim 21 wherein said amplifier comprises an operational amplifier having a pair of input points coupled to said balanced input circuit.

25. A circuit as defined in claim 24 wherein said amplifier has a gain less than unity.

26. A circuit as defined in claim 20 wherein said detecting means comprises a first comparator.

27. A circuit as defined in claim 26 wherein said first comparator has a first input pin coupled to said amplifier for receiving said control signal and a reference input pin coupled to said select means.

28. A circuit as defined in claim 27 wherein said select means includes means for providing said reference input pin with a first reference voltage for selecting said first operating mode and a second reference voltage for selecting said second operating mode.

29. A circuit as defined in claim 28 wherein said first reference voltage is a positive voltage.

30. A circuit as defined in claim 29 wherein said second reference voltage is a negative voltage.

31. A circuit as defined in claim 28 wherein said first comparator includes an output pin for providing an intermediate binary signal and wherein said detecting means further includes a second comparator having a first input post coupled to said first comparator output pin for receiving said intermediate binary output signal, said second comparator further having a reference input post coupled to a voltage reference potential, and an output post for providing said binary output signal.

32. A circuit as defined in claim 31 further including an RC circuit coupled between said second comparator first input post and common potential.

33. A circuit as defined in claim 32 wherein said circuit is arranged for sensing the presence of an AC voltage at said pair of input terminals and wherein said RC circuit is arranged to maintain a substantially constant potential at said second comparator first input post for sensed AC voltages, said RC circuit being responsive to said intermediate binary signal representative of said sensed AC voltage, and said second comparator providing a constant binary output at said second comparator output post.

34. A circuit as defined in claim 33 wherein said RC circuit is arranged to maintain said substantially constant potential for sensed DC voltages and for sensed AC voltages having frequencies of at least fifty Hertz.

35. A circuit as defined in claim 32 wherein said detecting means further comprises a diode coupling said first comparator output pin to said second comparator first input post.

36. A circuit as defined in claim 32 wherein said RC circuit is arranged to cause said binary output signal to toggle responsive to AC voltage sensed at said pair of input terminals having frequencies of about 10 Hertz or less.

37. An input condition sensing circuit for sensing electrical parameters in a subject device, the circuit being selectively operable in a first mode for effecting said sensing of voltage potential or in a second mode for effecting said sensing of impedance, the circuit generating a binary output signal having a high state or a low state representative of said sensing, the circuit comprising:
an input means for receiving a sensed electrical parameter, said input means being operatively connectable with said subject device appropriately to effect said sensing;
an amplifier means for generating a control signal, said amplifier means receiving said sensed electrical parameter from said input means, said control signal having an amplitude representative of said sensed electrical parameter;
a detecting means for providing said binary output signal, said detecting means being responsive to said control signal; and
a select means for selectively conditioning the circuit to operate in said first mode or said second mode;
said selective conditioning operatively configuring the circuit for generating opposite of said high state and said low state for representing sensing of presence a voltage potential and for representing sensing of a high impedance, thereby representatively reversing natural concurrence of voltage potential and impedance.

* * * * *